United States Patent
Ho et al.

(10) Patent No.: US 7,925,960 B2
(45) Date of Patent: Apr. 12, 2011

(54) MEMORY AND METHOD FOR CHECKING READING ERRORS THEREOF

(75) Inventors: Wen-Chiao Ho, Tainan (TW); Chin-Hung Chang, Tainan (TW); Chun-Hsiung Hung, Hsinchu (TW); Kuen-Long Chang, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 1051 days.

(21) Appl. No.: 11/727,256

(22) Filed: Mar. 26, 2007

(65) Prior Publication Data

US 2008/0109697 A1    May 8, 2008

(30) Foreign Application Priority Data

Nov. 7, 2006  (TW) ................................ 95141200 A

(51) Int. Cl.
*G11C 29/00* (2006.01)
*G06F 7/02* (2006.01)
(52) U.S. Cl. .................... 714/773; 714/763; 714/819
(58) Field of Classification Search .................. 714/773, 714/763, 819
See application file for complete search history.

(56) References Cited

U.S. PATENT DOCUMENTS

| 4,814,903 | A | * | 3/1989 | Kulakowski et al. ........... 360/48 |
| 5,715,105 | A | * | 2/1998 | Katayama et al. ............... 360/48 |
| 6,012,839 | A | * | 1/2000 | Nguyen et al. ................. 714/755 |
| 7,370,260 | B2 | * | 5/2008 | Nahas ........................... 714/763 |
| 2005/0144551 | A1 | * | 6/2005 | Nahas ........................... 714/763 |
| 2008/0109697 | A1 | * | 5/2008 | Ho et al. ........................ 714/755 |

FOREIGN PATENT DOCUMENTS

| JP | 2005-004288 | | 1/2005 |
| WO | WO-2005/041108 A2 | | 5/2005 |

* cited by examiner

*Primary Examiner* — Joseph D Torres
(74) *Attorney, Agent, or Firm* — Rabin & Berdo, P.C.

(57) ABSTRACT

A method for checking reading errors of a memory includes receiving a first data fragment and accordingly generating a first ECC and a first count index; writing the first data fragment, the first ECC and the first count index into a memory; reading the first data fragment from the memory as a second data fragment, generating a second ECC and second count index according to the second data fragment; determining whether the first count index and second count index are equal; determining whether the first ECC and the second ECC are equal; and outputting the second data fragment when the first count index is equal to the second count index and the first ECC is equal to the second ECC.

26 Claims, 5 Drawing Sheets

1

MEMORY AND METHOD FOR CHECKING READING ERRORS THEREOF

This application claims the benefit of Taiwan application Serial No. 95141200, filed Nov. 7, 2006, the subject matter of which is incorporated herein by reference.

BACKGROUND OF THE INVENTION

1. Field of the Invention

The invention relates in general to a memory and method for checking reading errors thereof, and more particularly to a memory whose accuracy can be increased and memory space can be reduced in a reading operation, and method for checking reading errors thereof.

2. Description of the Related Art

A flash memory is one of the various applications of non-volatile memory technology today. The flash memory can be used for reading and writing data and the data stored in the flash memory can be maintained without electricity power, and thus it can be applied to various kinds of data storage. However, it is an essential subject in memory design to ensure completeness of the data stored in the memory. Traditionally, an error correction code (ECC) is used to meet the requirement. The error correction code is used to detect and correct a bit error in a conventional method for checking data completeness.

Referring to FIG. 1, a flow chart of a conventional method for checking memory reading errors is shown. First, in step 100, receive at least a data fragment. Following that, in step 110, generate an error correction code according to the at least data fragment through an ECC algorithm. The error correction code has a size corresponding to the at least data fragment. For example, when the at least a data fragment has a size of 256 bytes, the error correction code has a size of 22 bits due to requirement for calculating error correction parity bits and their complements.

Next, in step 120, write the at least data fragment and error correction code into the memory. Then, in step 130, read the at least a data fragment from the memory to be at least a reading data fragment. Afterward, in step 140, generate a new error correction code according to the at least a reading data fragment through an ECC algorithm. In step 150, determine whether the at least a reading data fragment is the same as the at least a data fragment according to the error correction code and new error correction code. In the step 150, substantially, an exclusive or operation is performed on the error correction code and new error correction code according to the ECC algorithm. If the result is 0, the at least a reading data fragment is the same as the at least a data fragment.

If the at leas a reading data fragment is the same as the at least a data fragment, in step 160, the memory determines the reading operation is correct and outputs the at least a reading data fragment. If the at least a reading data fragment is different from the at least a data fragment, in step 170, correct the at least a reading data fragment to be the at least a data fragment by using the new error correction code and output the at least a reading data fragment if the memory determines the reading operation has a 1 bit error.

In the above conventional method for checking memory reading errors, the ECC algorithm can detect and correct 1 bit error. However, it can only detect more than one bit error, such as 2, 3 or 4 bit errors, but can not correct these errors. It can only inform the memory that a number of bit errors are generated.

SUMMARY OF THE INVENTION

The invention is directed to a memory and method for checking reading errors thereof. By using a count index together with the error correction code, the memory can detect and correct a number of bit errors to improve correctness of memory reading operation and save memory space.

According to a first aspect of the present invention, a method for checking reading errors of a memory is provided. The method comprises receiving a first data fragment; generating a first ECC and a first count index according to the first data fragment, wherein the first count index is corresponding to a quantity of one kind of binary value in the first data fragment; writing the first data fragment, the first error correction code and the first count index into a memory; reading the first data fragment from the memory as a second data fragment; generating a second error correction code and a second count index according to the second data fragment; determining whether the first count index and the second count index are equal; determine whether the first error correction code and the second error correction code are equal; and outputting the second data fragment when the first count index and the second count index are equal, and the first error correction code and the second error correction code are equal.

According to a second aspect of the present invention, a memory is provided. The memory comprises a memory-cell array, an error correction circuit and an n-bit counter. The memory-cell array is for receiving and storing a first data fragment, and reading the first data fragment from the memory-cell array to be a second data fragment. The error correction circuit is for generating a first ECC according to the first data fragment and generating a second ECC according to the second data fragment. The n-bit counter is for generating a first count index and a second count index, wherein the first count index and the second count index are respectively corresponding to a quantity of one kind of binary value occurred in the first data fragment and a quantity of one kind of binary value occurred in the second data fragment, and n is a positive integer. The memory determines whether the second data fragment is equal to the first data fragment according to the first count index, the second count index, the first error correction code and the second error correction code. When the second data fragment has y bit errors as compared to the first data fragment, the memory corrects the second data fragment to be the first data fragment and outputs the second data fragment, and y is a positive integer smaller or equal to n.

The invention will become apparent from the following detailed description of the preferred but non-limiting embodiments. The following description is made with reference to the accompanying drawings.

DETAILED DESCRIPTION OF THE INVENTION

The invention is directed to a memory and method for checking reading errors thereof. By using a count index generated by an extra counter together with the error correction code generated by the ECC algorithm, the memory can detect and correct a number of bit errors to improve correctness of memory reading operation and save memory space.

Figure 1:
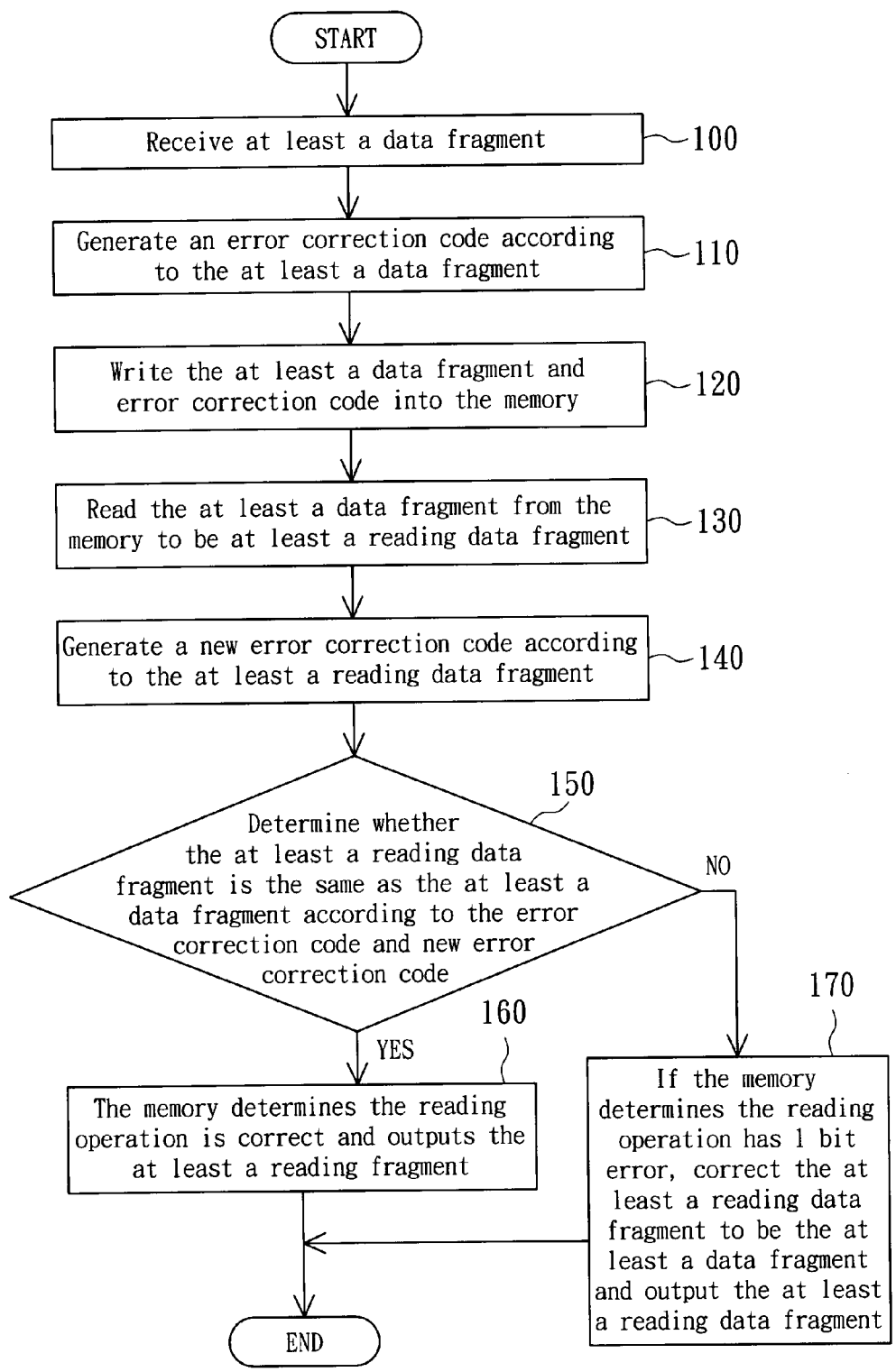
FIG. 1 is a flow chart of a conventional method for checking memory reading errors.
Figure 2:
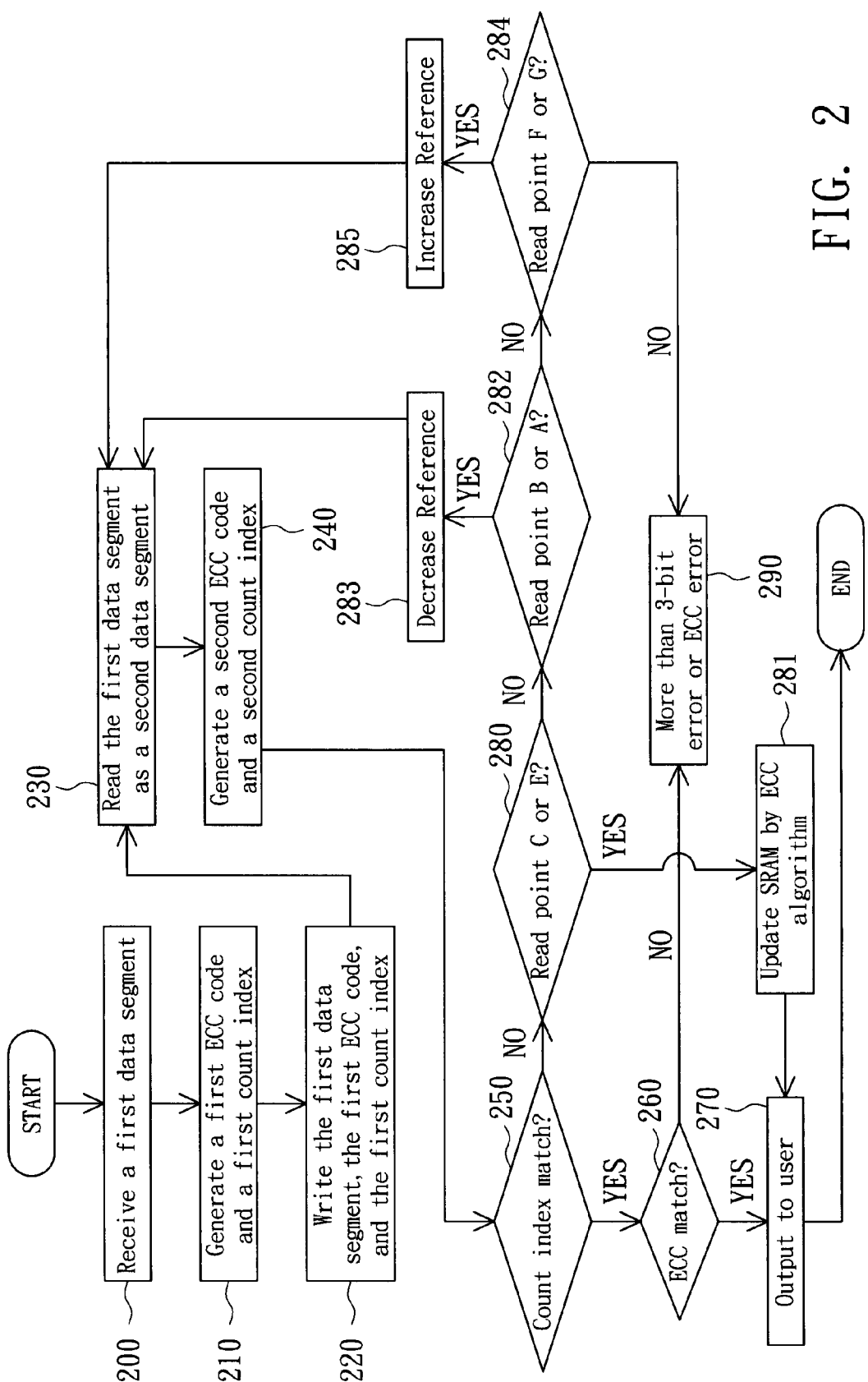
FIG. 2 is a flow chart of a method for checking memory reading errors according to a preferred embodiment of the invention.

Referring to FIG. 2, a flow chart of a method for checking memory reading errors according to a preferred embodiment of the invention is shown. The method is applied to a memory which can be a non-volatile memory, such as a single-level-cell (SLC) flash memory or a multi-level-cell (MLC) flash memory. First, in step 200, receive a first data fragment, such as, formed by 1 and 0.

Then, in step 210, generate a first error correction code and a first count index according to the first data fragment. The first error correction code is generated by an ECC algorithm and has a size corresponding to the first data fragment. Owing that the invention only needs to calculate the size of error correction parity bits and their complements, when the first data fragment has a size of 256 bytes for instance, the first error correction code has a size of 11 bits. The first count index is corresponding to a quantity of one kind of binary value, such as a number of 1 occurred in the first data fragment and has a size of n bits, wherein n is a positive integer. Therefore, the method for checking memory reading errors disclosed in the embodiment can determine n bit errors in maximum.

Figure 3:
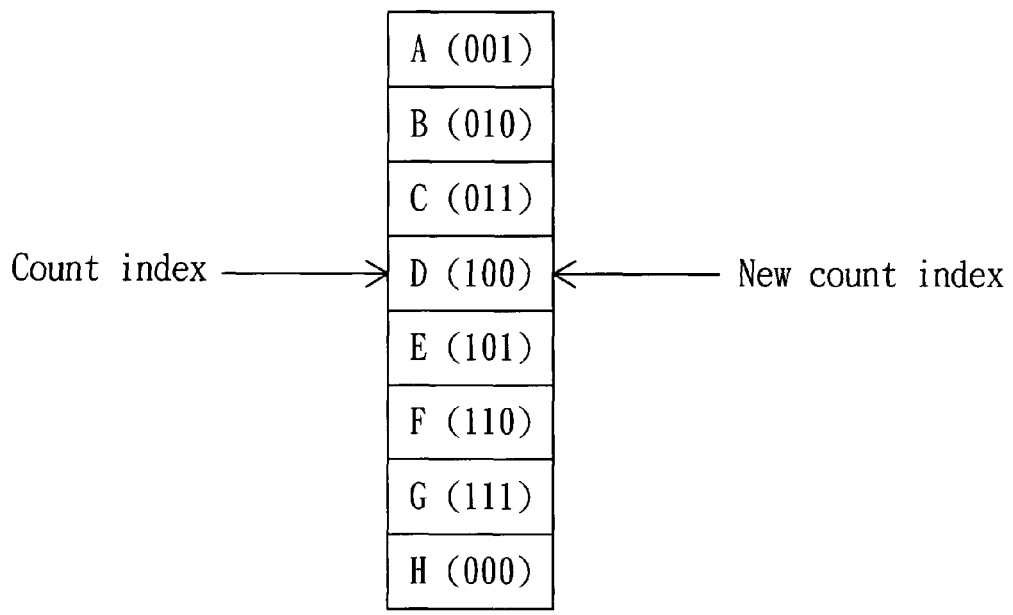
FIG. 3 is a schematic diagram of a count index in the method for checking memory reading errors according to the preferred embodiment of the invention.

The first data fragment is exemplified to have 256 bytes and the first count index is exemplified to have 3 bits for illustration, but the invention is not limited thereto. Referring to FIG. 3, a schematic diagram of a count index in the method for checking memory reading errors according to the preferred embodiment of the invention is shown. If the first data fragment has 68 1s and 1980 0s, the first count index starts from H(000), counts a number of 1 occurred in the first data fragment by following an order of A to H, and stops at a position of D(100).

Following that, in step 220, write the first data fragment, first error correction code and first count index into the memory. Next, in step 230, read the first data fragment from the memory to be a second data fragment which is also formed by 1 and 0 for instance. Then, in step 240, generate a second error correction code and a second count index according to the second data fragment. The second error correction code is generated by an ECC algorithm and the second count index, which has a size of n bits, is corresponding to a quantity of one kind of binary value, such as, a number of 1 occurred in the second data fragment.

Afterward, in step 250, determine whether the first count index and the second count index are equal, that is, determine whether the number of 1 in the first data fragment is equal to the number of 1 in the second data fragment. If the first count index is the same as the second count index, the second count index also stops in the position of D(100) and then in step 260, determine whether the first ECC code and the second ECC code are equal. In the step 260, substantially, an exclusive or operation is performed on the first error correction code and second error correction code according to the ECC algorithm. If the result is 0, the first ECC code and the second ECC code are equal.

If the first ECC code is the same as the second ECC code, in step 270, the memory determines the reading operation is correct and outputs the first data fragment to the user. If the first ECC code is not equal to the second ECC code, in step 290, it is determined that there is ECC error. Besides, when the first count index is not equal to the second count index, in step 280, determine if the first count index differs from the second count index by 1. If the first count index differs from the second count index by 1, for example, the first count index is located at the position of D(100), and the second count index (read point) is located at a position of C(011) or E(101), in step 281, update SRAM by ECC algorithm to directly correct the second data fragment to be the first data fragment and go back to the step 270 to output the first data fragment to the user. When the first count index differs from the second count index by 1, the second data fragment has 1 bit error as compared to the first data fragment.

In the step 280, if the first count index does not differ from the second count index by 1, in step 282, determine if the second count index is smaller than the first count index by 2 or 3, that is, if the first count index is located at the position of D(100), the second count index (read point) is located in a position of A(001), or B(010). If yes, in step 283, decrease a reference current of the memory in the reading operation and return to the step 230 in which the memory reads the first data fragment to be a second data fragment. If no, in step 284, determine if the second count index is larger than the first count index by 2 or 3, that is, if the first count index is located at the position of D(100), the second count index (read point) is located in a position of F(110) or G(111). If yes, increase a reference current of the memory in the reading operation and return to the step 230. If no, the second count index is at H(000) if the first count index is at D(100) and it is determined that there are more than 3 bit errors in step 290. When the first count index differs from the second count index by m, the second data fragment has m bit errors as compared to the first data fragment, wherein m is a positive integer larger than 1 and smaller than or equal to n. The number n is 3 and m is 2 or 3 in the embodiment.

Figure 4:
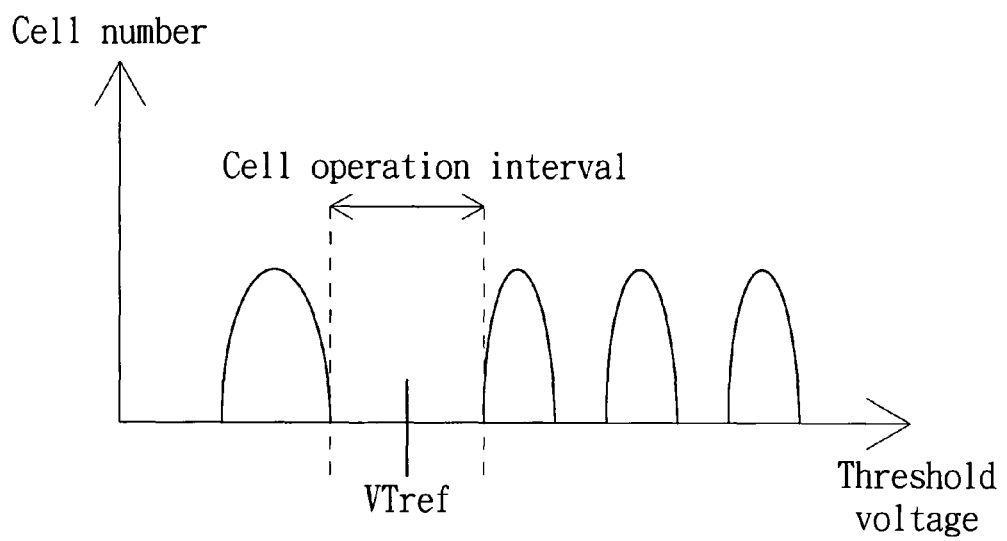
FIG. 4 is a distribution diagram of threshold voltages of the memory cells in the memory according to the preferred embodiment of the invention.

Referring to FIG. 4, a distribution diagram of threshold voltages of the memory cells in the memory according to the preferred embodiment of the invention is shown. The memory of FIG. 4 is exemplified to be a MLC flash memory for illustration, but the invention is not limited thereto. When a drain current of the memory cell is larger than a reference current outputted by a reference unit, the threshold voltage of the memory cell is determined to be smaller than a reference threshold voltage VTref, that is, the data fragment stored in the memory cell is 1. When the drain current of the memory cell is smaller than the reference voltage outputted by the reference unit, the threshold voltage of the memory cell is determined to be larger than the reference threshold voltage VTref, that is, the data fragment stored in the memory cell is 0.

Therefore, in step 250, when the first count index is larger than the second count index by m, that is, if the first count index is located at the position of D(100), the second count index is located in a position of A(001) or B(010), which represents 2 or 3 1s are neglected in reading. Then, in the operation interval of the memory, the reference threshold voltage is shifted to the right, that is, the reference current is reduced and the step 230 is repeated to perform a reading operation. When the first count index is smaller than the second count index by m, that is, if the first count index is located in the position of D(100), the second count index is located in a position of F(110) or G(111), which represents 2 or 3 extra 1s are read. Therefore, in the operation interval of the memory, the reference threshold voltage VTref is shifted to the left, that is, the reference current is increased and the step 230 is repeated to perform the reading operation.

Figure 5:
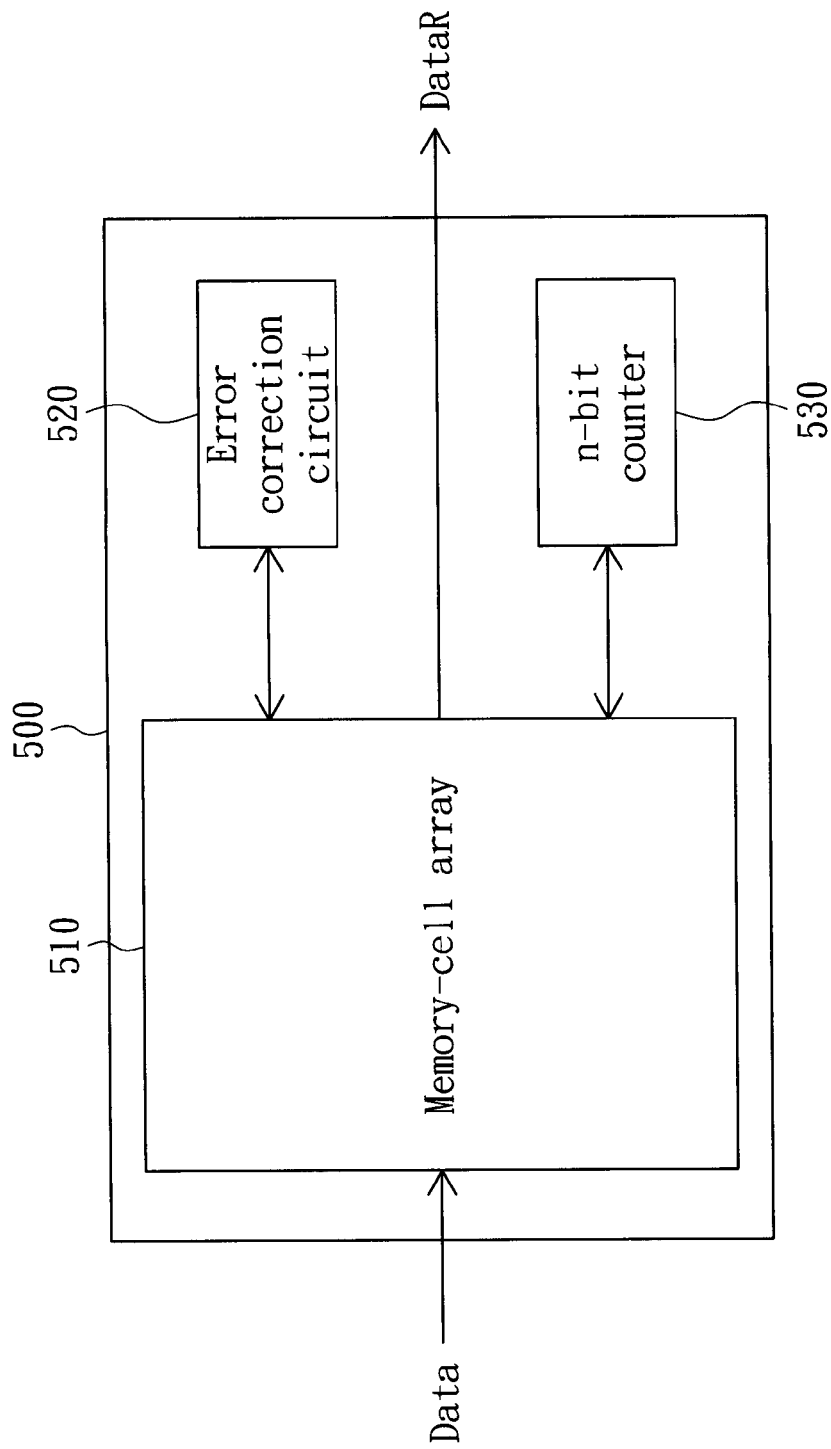
FIG. 5 is a block diagram of a memory according to the preferred embodiment of the invention.

Referring to FIG. 5, a block diagram of a memory according to the preferred embodiment of the invention is shown. A memory 500 is a non-volatile memory, such as a SLC flash memory or a MLC flash memory and includes a memory-cell array 510, an error correction circuit 520 and an n-bit counter 530. The memory-cell array 510 is for receiving and storing a first data fragment Data, such as formed by 1 and 0, and the memory 500 reads the first data fragment Data from the memory-cell array 510 to be a second data fragment DataR, which is formed by 1 and 0 for instance.

The error correction circuit 520 is for generating a first error correction code according to the first data fragment Data and generating a second error correction code according to the first reading data fragment. The n-bit counter 530 is for generating a first count index and second count index, which are respectively corresponding to a quantity of one kind of binary value, such as a number of 1 occurred in the first data fragment Data and in the second data fragment DataR, wherein n is a positive integer.

The memory determines whether the second fragment DataR is the same as the first data fragment Data by using the first count index, second count index, first error correction code and second error correction code. When the second data fragment DataR has y bit errors as compared to the first data fragment Data, the memory corrects the second data fragment DataR to be the first data fragment Data and outputs the second data fragment, wherein y is a positive integer smaller than or equal to n.

Figure 6:
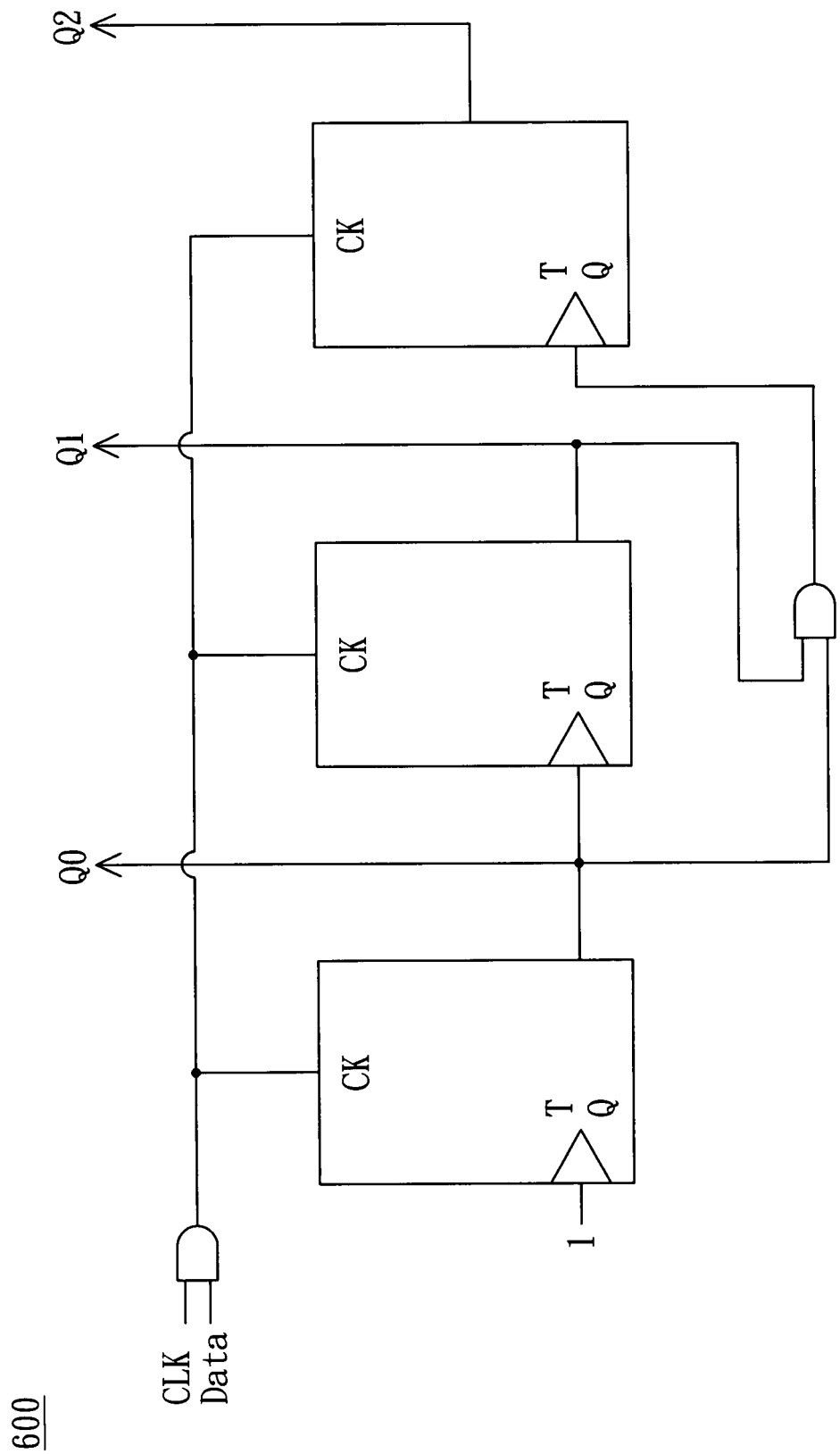
FIG. 6 is a circuit diagram of a 3-bit counter according to the preferred embodiment of the invention.

The invention is not limited to the above n-bit counter circuit. In fact, any other counting circuit, such as a circuit with n trigger flip-flops (T-FF), can be applied to the n-bit counter circuit of the memory 500. Referring to FIG. 6, a circuit diagram of a 3-bit counter according to the preferred embodiment of the invention is shown. A 3-bit counter 600 uses 3 T-FFs to perform a counting operation according to a clock signal CLK of the memory 500 and the data fragment Data. Besides, the method for checking reading errors of the memory 500 has been described in detailed in the method for checking memory reading errors disclosed by the above embodiment of the invention. Therefore, any detail is not necessary to be given here again.

In the memory and method for checking reading errors thereof disclosed by the above embodiment of the invention, by using the count index generated by an extra counter together with the error correction code generated by an ECC algorithm, the memory can detect and correct a number of bit errors to improve the correctness of memory reading operation. Moreover, the invention needs only to count one of the error correction parity bits and the corresponding complement. Therefore, when the data fragment has a size of 256 bytes for instance, the error correction code has a size of 11 bits. If a 3-bit counter is applied, the error correction code and count index totally need to be 14 bits. Therefore, the method of the invention can save much memory space as compared to the prior-art method.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for checking reading errors of a memory, comprising:
   receiving a first data fragment;
   generating a first error correction code (ECC) and a first count index according to the first data fragment, wherein the first count index is corresponding to a quantity of one kind of binary value in the first data fragment;
   writing the first data fragment, the first error correction code and the first count index into a memory;
   reading the first data fragment from the memory as a second data fragment;
   generating a second error correction code and a second count index according to the second data fragment;
   determining whether the first count index and the second count index are equal;
   determine whether the first error correction code and the second error correction code are equal; and
   outputting the second data fragment when the first count index and the second count index are equal, and the first error correction code and the second error correction code are equal.

2. The method according to claim 1, wherein the binary value is 1.

3. The method according to claim 2, wherein the memory is a single-level-cell (SLC) flash memory.

4. The method according to claim 2, wherein the memory is a multi-level-cell (MLC) flash memory.

5. The method according to claim 1, wherein the binary value is 0.

6. The method according to claim 1, wherein the memory is a non-volatile memory.

7. The method according to claim 1, wherein the first count index is obtained by using an n-bit counter, and n is a positive integer.

8. The method according to claim 7, wherein the method for checking reading errors of a memory can determine the second data fragment has n bit errors at most as compared to the first data fragment.

9. The method according to claim 7, further comprising:
   if the first count index is not equal to the second count index and the first count index differs from the second count index by 1, correcting the second data fragment to be the first data fragment by using the second correction code, and outputting the second data fragment.

10. The method according to claim 9, wherein if the first count index differs from the second count index by 1, the second data fragment has 1 bit error as compared to the first data fragment.

11. The method according to claim 7, further comprising:
    if the first count index is not equal to the second count index and the first count index differs from the second count index by x, correcting the second data fragment to be the first data fragment by using the second correction code, and outputting the second data fragment, wherein x is a positive integer and less than a positive integer m.

12. The method according to claim 11, wherein if the first count index differs from the second count index by x, the second data fragment has x bits error as compared to the first data fragment.

13. The method according to claim 7, further comprising:
    if the first count index is not equal to the second count index and the first count index differs from the second count index by m, changing a reference current of the memory in the reading operation; and
    reading again the first data fragment from the memory to be the second data fragment;
    wherein m is a positive integer larger than 1 and smaller than or equal to n.

14. The method according to claim 13, wherein if the first count index is larger than the second count index by m, reducing the reference current and if the first count index is smaller than the second count index by m, increasing the reference current.

15. The method according to claim 13, wherein if the first count index differs from the second count index by m, the second data fragment has m bit errors as compared to the first data fragment.

16. A memory, comprising:
   a memory-cell array, for receiving and storing a first data fragment, reading the first data fragment from the memory-cell array to be a second data fragment;
   an error correction circuit, for generating a first error correction code (ECC) according to the first data fragment and generating a second error correction code according to the second data fragment; and
   an n-bit counter, for generating a first count index and a second count index, wherein the first count index and the second count index are respectively corresponding to a quantity of one kind of binary value occurred in the first data fragment and a quantity of one kind of binary value occurred in the second data fragment, and n is a positive integer;
   wherein the memory determines whether the second data fragment is equal to the first data fragment according to the first count index, the second count index, the first error correction code and the second error correction code;
   wherein when the second data fragment has y bit errors as compared to the first data fragment, the memory corrects the second data fragment to be the first data fragment and outputs the second data fragment, and y is a positive integer smaller or equal to n.

17. The memory according to claim 16, is a non-volatile memory.

18. The memory according to claim 17, is a single-level-cell flash memory.

19. The memory according to claim 17, a multi-level-cell flash memory.

20. The memory according to claim 16, wherein if the first count index differs from the second count index by 1, the memory corrects the second data fragment to be the first data fragment by using the second correction code, and outputs the second data fragment.

21. The memory according to claim 20, wherein if the first count index differs from the second count index by 1, the second data fragment has 1 bit error as compared to the first data fragment.

22. The memory according to claim 16, wherein if the first count index differs from the second count index by m, the memory changes a reference current of the reading operation to read again the first data fragment from the memory to be the second data fragment, wherein m is a positive integer larger than 1 and smaller than or equal to n.

23. The memory according to claim 22, wherein if the first count index is larger than the second count index by m, the memory reduces the reference current and if the first count index is smaller than the second count index by m, the memory increases the reference current.

24. The memory according to claim 22, wherein if the first count index differs from the second count index by m, the second data fragment has m bit errors as compared to the first data fragment.

25. The method according to claim 16, further comprising:
   if the first count index is not equal to the second count index and the first count index differs from the second count index by x, correcting the second data fragment to be the first data fragment by using the second correction code, and outputting the second data fragment, wherein x is a positive integer and less than m.

26. The method according to claim 25, wherein if the first count index differs from the second count index by x, the second data fragment has x bits error as compared to the first data fragment.

* * * * *